US010580761B2

(12) United States Patent
Cheah et al.

(10) Patent No.: US 10,580,761 B2
(45) Date of Patent: Mar. 3, 2020

(54) SYSTEMS IN PACKAGES INCLUDING WIDE-BAND PHASED-ARRAY ANTENNAS AND METHODS OF ASSEMBLING SAME

(71) Applicant: Intel Corporation, Santa Clara, CA (US)

(72) Inventors: Bok Eng Cheah, Bukit Gambir (MY); Jackson Chung Peng Kong, Tanjung Tokong (MY); Boon Ping Koh, Seberang Jaya (MY); Kooi Chi Ooi, Glugor (MY)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 16/019,023

(22) Filed: Jun. 26, 2018

(65) Prior Publication Data
US 2019/0181126 A1 Jun. 13, 2019

(30) Foreign Application Priority Data
Dec. 13, 2017 (MY) .................... 2017704783

(51) Int. Cl.
H01L 25/16 (2006.01)
H01L 23/498 (2006.01)
H01L 25/00 (2006.01)
H01Q 21/22 (2006.01)
H01Q 1/52 (2006.01)
H01Q 21/00 (2006.01)
H01Q 1/22 (2006.01)
(Continued)

(52) U.S. Cl.
CPC ........ H01L 25/16 (2013.01); H01L 23/49816 (2013.01); H01L 23/49822 (2013.01); H01L 23/49827 (2013.01); H01L 23/5389 (2013.01); H01L 23/552 (2013.01); H01L 23/66 (2013.01); H01L 24/16 (2013.01); H01L 24/19 (2013.01); H01L 25/50 (2013.01); H01Q 1/2283 (2013.01); H01Q 1/526 (2013.01); H01Q 21/0087 (2013.01); H01Q 21/22 (2013.01); H01L 2223/6677 (2013.01); H01L 2224/04105 (2013.01); H01L 2224/12105 (2013.01); H01L 2224/16267 (2013.01); H01L 2924/1421 (2013.01); H01L 2924/3025 (2013.01)

(58) Field of Classification Search
CPC ......... H01L 23/49816; H01L 23/49822; H01L 23/49827; H01L 24/16; H01L 25/16; H01L 25/50; H01Q 1/2283; H01Q 1/526; H01Q 21/22
See application file for complete search history.

(56) References Cited

U.S. PATENT DOCUMENTS 10,050,013 B2 * 8/2018 Tang ................ H01L 21/565
10,141,271 B1 * 11/2018 Xu .................. H01L 23/552
(Continued)

Primary Examiner — Allan R Wilson
(74) Attorney, Agent, or Firm — Schwegman Lundberg & Woessner, P.A.

(57) ABSTRACT

A system-in-package includes a package substrate that at least partially surrounds an embedded radio-frequency integrated circuit chip and a processor chip mated to a redistribution layer. A wide-band phased-array antenna module is mated to the package substrate with direct interconnects from the radio-frequency integrated circuit chip to antenna patches within the antenna module. Additionally, fan-out antenna pads are also coupled to the radio-frequency integrated circuit chip.

21 Claims, 9 Drawing Sheets

(51) Int. Cl.
*H01L 23/00* (2006.01)
*H01L 23/66* (2006.01)
*H01L 23/552* (2006.01)
*H01L 23/538* (2006.01)

(56) References Cited

U.S. PATENT DOCUMENTS

| | | | |
|---|---|---|---|
| 10,431,511 B2 * | 10/2019 | Kim | H01L 23/49838 |
| 2014/0176368 A1 * | 6/2014 | Kamgaing | H01P 11/00 |
| | | | 343/700 MS |
| 2015/0001689 A1 * | 1/2015 | Goetz | H01L 23/552 |
| | | | 257/659 |
| 2016/0056544 A1 * | 2/2016 | Garcia | H01Q 21/28 |
| | | | 343/725 |
| 2016/0329299 A1 * | 11/2016 | Lin | H01L 23/5226 |
| 2017/0077072 A1 * | 3/2017 | Yap | H01L 25/105 |
| 2017/0324160 A1 * | 11/2017 | Khoury | H01Q 1/526 |
| 2018/0316319 A1 * | 11/2018 | Kim | H01L 23/49816 |

* cited by examiner

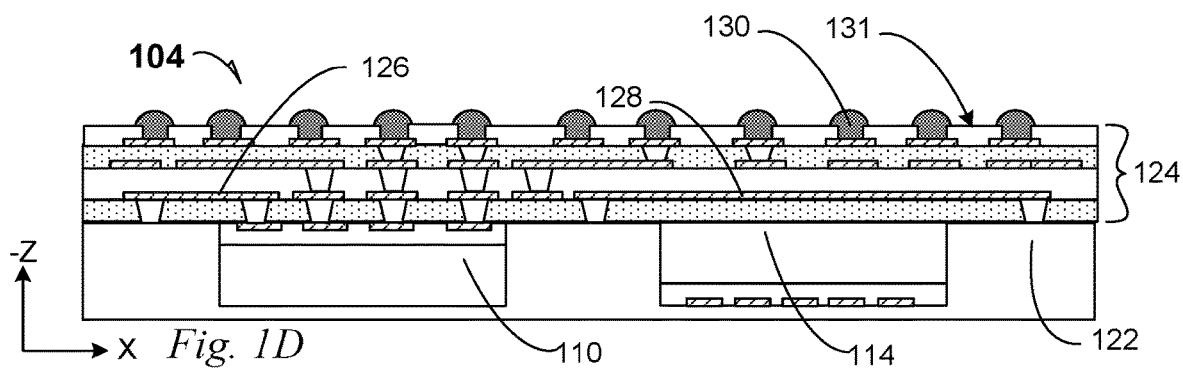
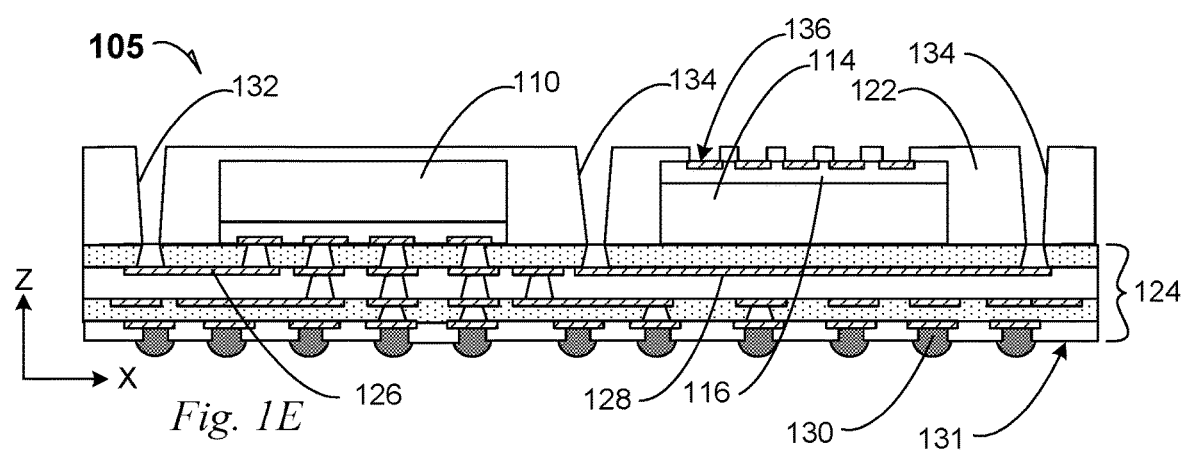
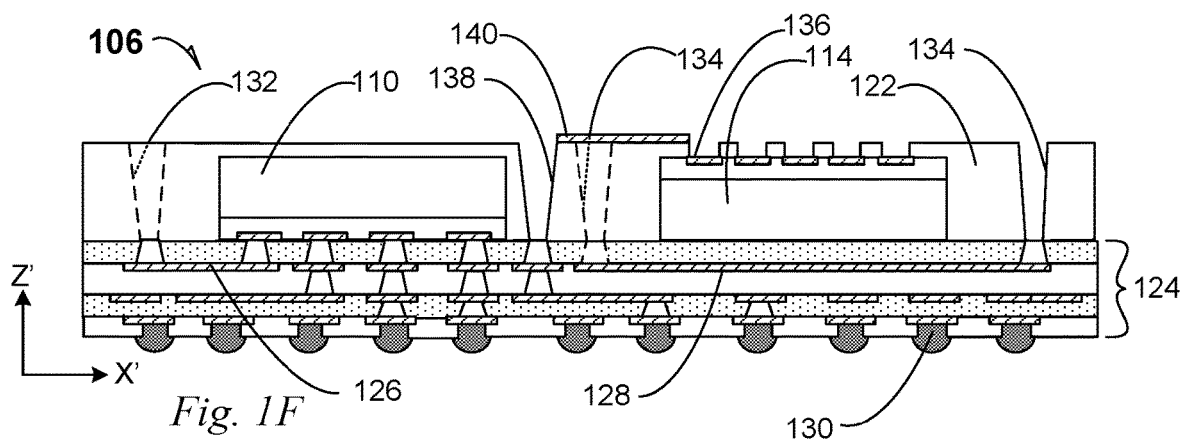

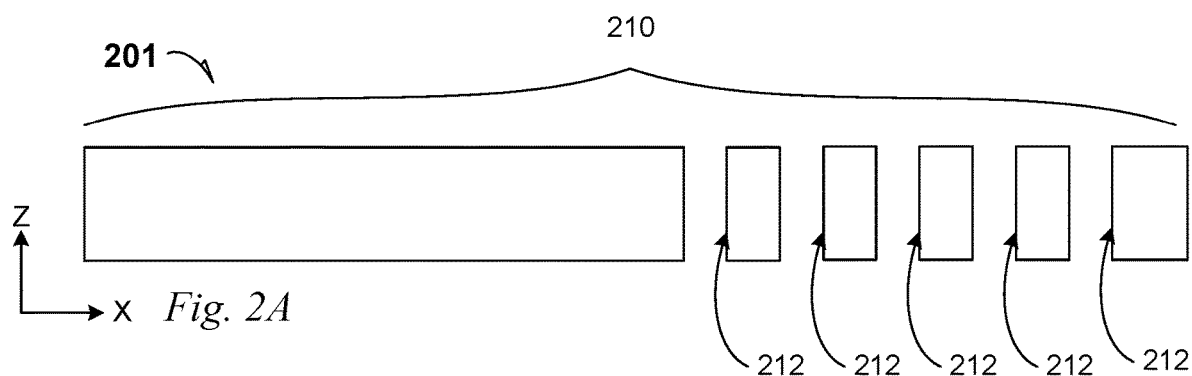
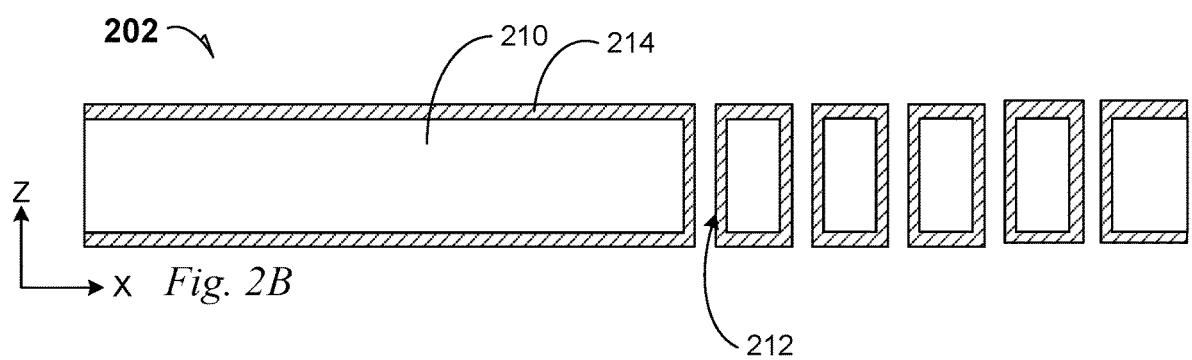
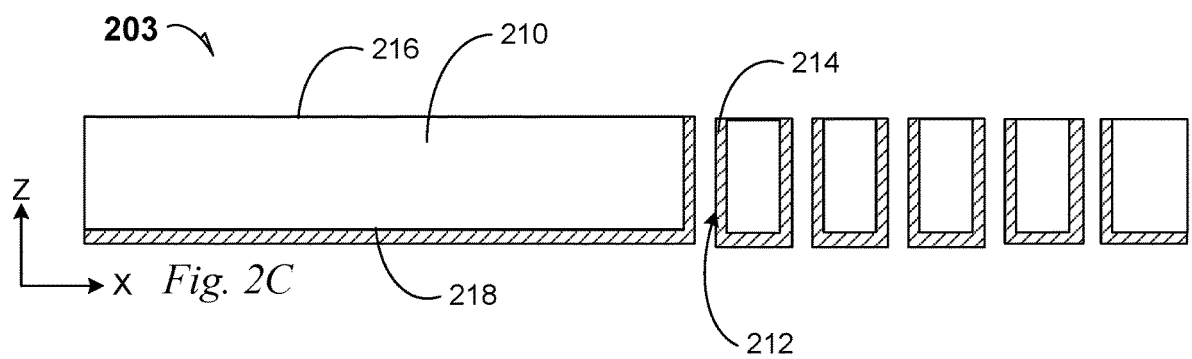
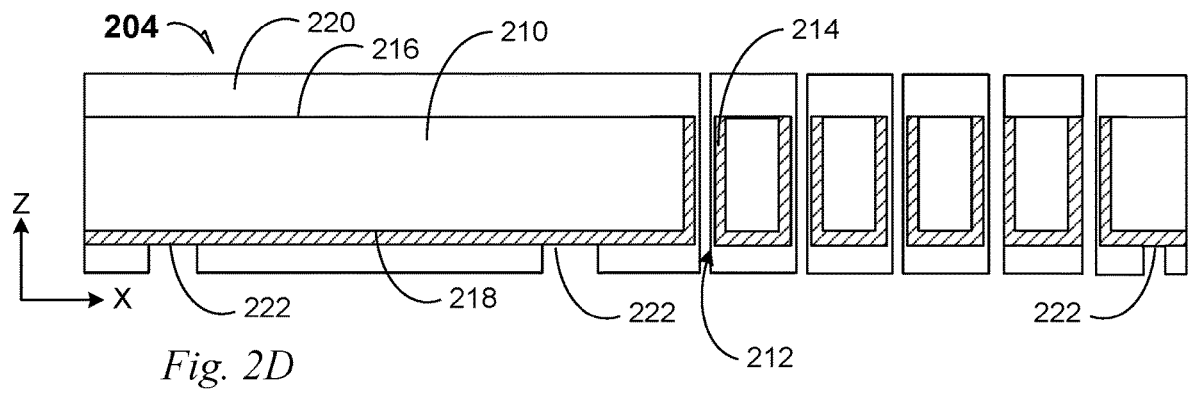

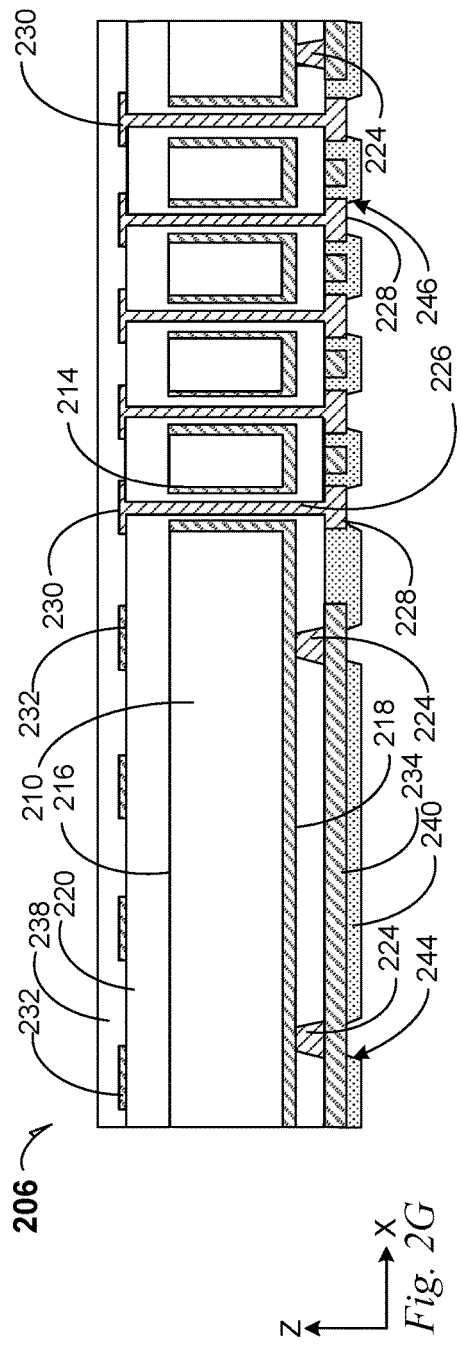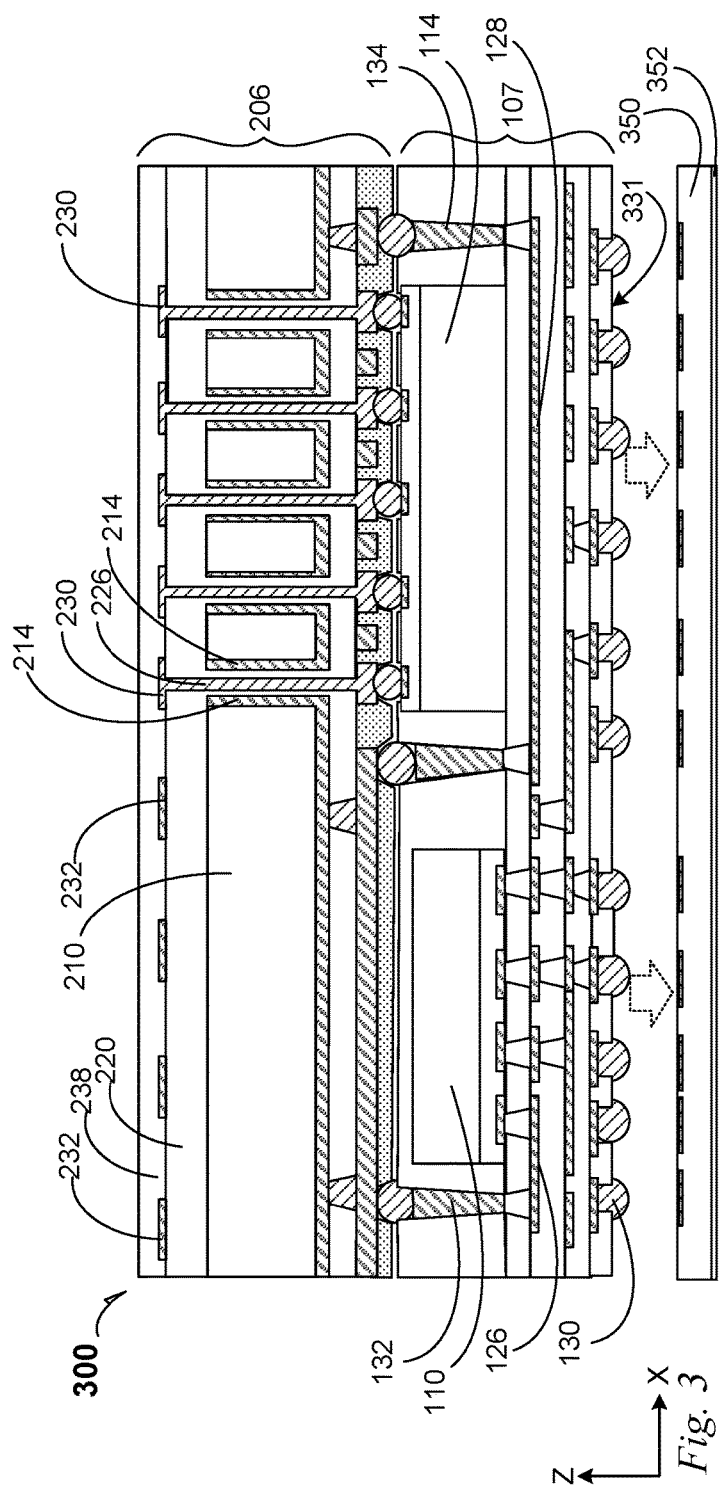

SYSTEMS IN PACKAGES INCLUDING WIDE-BAND PHASED-ARRAY ANTENNAS AND METHODS OF ASSEMBLING SAME

PRIORITY APPLICATION

This application claims the benefit of priority to Malaysian Application Serial Number PI 2017704783, filed Dec. 13, 2017, which is incorporated herein by reference in its entirety.

FIELD

This disclosure relates to semiconductor device packages that include wide-band communications arrays.

BACKGROUND

Semiconductive device miniaturization during packaging includes challenges to locate radio-frequency antennas close to the active devices, and the act of miniaturizing the antennas to keep pace with semiconductor device miniaturization.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1D is a cross-section elevation of the semiconductor device package depicted in FIG. 1C after further processing according to an embodiment;

FIG. 1E is a cross-section elevation of the semiconductor device package depicted in FIG. 1D after further processing according to an embodiment;

FIG. 1F is a cross-section elevation of the semiconductor device package depicted in FIG. 1E, and taken at a different cross section (X'-Z' in the Y-coordinate direction out of the plane of FIG. 1E) according to an embodiment;

FIG. 2A is a cross-section elevation of a phased-array antenna module according to an embodiment;

FIG. 2B is a cross-section elevation of the phased-array antenna module depicted in FIG. 2A after further processing according to an embodiment;

FIG. 2C is a cross-section elevation of the phased-array antenna module depicted in FIG. 2B after further processing according to an embodiment;

FIG. 2D is a cross-section elevation of the phased-array antenna module depicted in FIG. 2C after further processing according to an embodiment;

FIG. 2G is a cross-section elevation of the phased-array antenna module depicted in FIG. 2E after further processing according to an embodiment;

FIG. 3 is a cross-section elevation of a wafer-level fan-out package with wide-band phased array antennas according to an embodiment;

DETAILED DESCRIPTION

A radio-frequency (RF) antenna in a semiconductor device package is located close to the active devices with designs that minimize RF loss through shortened semiconductor-package routing and RF device noise shielding. Packaged antenna arrays with the semiconductor device package embodiments are configured in a form factor to facilitate minimized RF loss and useful interconnections between the semiconductor device package and the antenna array package.

Figure 1A:
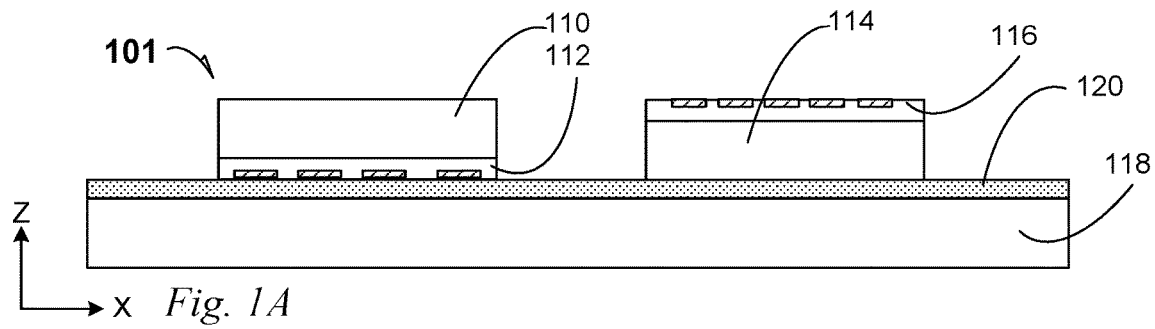
FIG. 1A is a cross-section elevation of a wafer-level fabricated fan-out semiconductor device package during fabrication of a system-in-package that includes a phased-array antenna module according to an embodiment.

FIG. 1A is a cross-section elevation of a wafer-level fabricated fan-out semiconductor device package 101 during fabrication of a system-in-package that includes a phased-array antenna module according to an embodiment. In an embodiment, a processor die 110 including a transistor active area 112 and a radio-frequency integrated circuit (RFIC) die 114 with a transistor active area 114 are seated onto a carrier 118 by an adhesive layer 120. The processor die 110 is seated with the active area 112 facing the carrier 118, and the RFIC die 114 is seated with the active area 116 facing away from the carrier 118. The active area 112 of the processor die 110 is disposed opposite and parallel planar with a processor die backside surface 113. With respect to the RFIC die, the active area 116 may be referred to as the RFIC first surface 116, and the surface opposite and parallel planar with the RFIC first surface 116 may be referred to as the RFIC die backside surface 117. In an embodiment, the active surface may be referred to as a first surface and the backside surface may be referred to as a second surface.

In an embodiment, the carrier 118 is an organic carrier such as a FR4 board. In an embodiment, the carrier 118 is a silicon carrier such as a silicon wafer. In an embodiment, the carrier 118 is an inorganic carrier such as a glass panel.

Figure 1B:
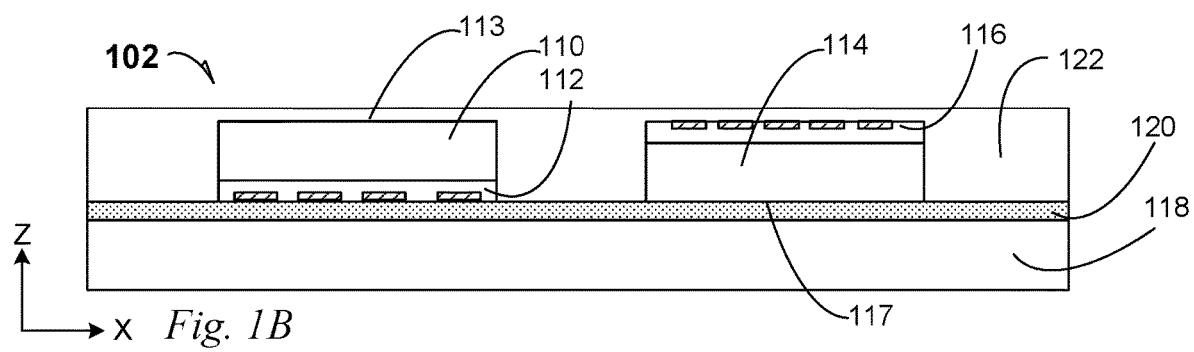
FIG. 1B is a cross-section elevation of the semiconductor device package depicted in FIG. 1A after further processing according to an embodiment.

FIG. 1B is a cross-section elevation of the semiconductor device package 101 depicted in FIG. 1A after further processing according to an embodiment. The semiconductor device package 102 has been overmolded by a cover 122 to enclose the processor die 110 and the RFIC die 114. In an embodiment, the cover 122 is an organic compound that is useful for patterning electrical traces on one surface of the cover 122. In an embodiment, the cover 122 is an organic compound that is useful for trench drilling for useful electrical connections. In an embodiment, the cover 122 is an organic compound that is useful for trench forming for useful electronic shielding.

Figure 1C:
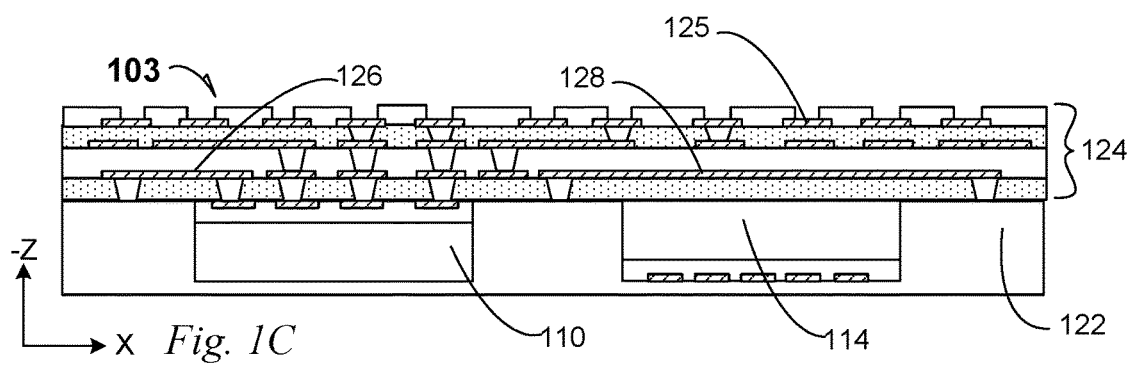
FIG. 1C is a cross-section elevation of the semiconductor device package depicted in FIG. 1B after further processing according to an embodiment.

FIG. 1C is a cross-section elevation of the semiconductor device package 102 depicted in FIG. 1B after further processing according to an embodiment. The semiconductor device package 103 has been inverted, as indicated by the negative-Z coordinate, and the carrier 110 and adhesive 120 (see FIGS. 1A and 1B) have been removed.

In an embodiment, a redistribution layer (RDL) 124 have been formed to couple directly with the processor die 110, but not directly with the RFIC die 114. In an embodiment, the RDL 124 includes at least one reference voltage (VSS), or ground trace 126 that is coupled to the processor die 110. In an embodiment, an RFIC VSS trace 128 is constructed near the RFIC die 114, and the RFIC trace 128 is configured to carry the same reference voltage as the VSS trace 126.

As illustrated, the RDL 124 exhibits three dielectric layers including at least two trace layers, and bond pads 125 connected to the dielectric layer farthest from the cover 122. Other RDL configurations may be selected according to a useful application for a given semiconductor device package embodiment.

FIG. 1D is a cross-section elevation of the semiconductor device package 103 depicted in FIG. 1C after further processing according to an embodiment. The semiconductor device package 104 has been processed to form a solder-paste electrical-bump array 130 in bond-pad opens in the RDL 124 that includes a land side 131 of the RDL 124. In an embodiment, formation of the electrical-bump array 130 is carried out later in processing after further action on the cover 122.

FIG. 1E is a cross-section elevation of the semiconductor device package 104 depicted in FIG. 1D after further processing according to an embodiment. The semiconductor device package 105 has been re-inverted, as indicated by the positive-Z coordinate, and the cover 122 has been selectively opened. In an embodiment, a through-mold via 132 has been formed in the cover 122 to expose a contact that is coupled to the reference-voltage trace 126. In an embodiment, a through-mold trench 134 has been opened around the RFIC die 114 in preparation for a shielding wall. Additionally, recesses 136 have been opened in the cover 122 to expose bond pads associated with the active area 116 of the RFIC die 114.

FIG. 1F is a cross-section elevation of the semiconductor device package 105 depicted in FIG. 1E, and taken at a different cross section (X'-Z' in the Y-coordinate direction, out of the plane of FIG. 1E) according to an embodiment. The semiconductor device package 106 has been processed, not only to open the through-mold via 132 and the through-mold trench 134 (depicted in ghosted lines with the center occurrence), an RFIC through-mold via 138 has been opened in the cover 122, and an RFIC communication trace 140 has been patterned on the cover 122 to allow communication between the RFIC die 114 and the processor die 110 through the RDL 124.

Figure 1G:
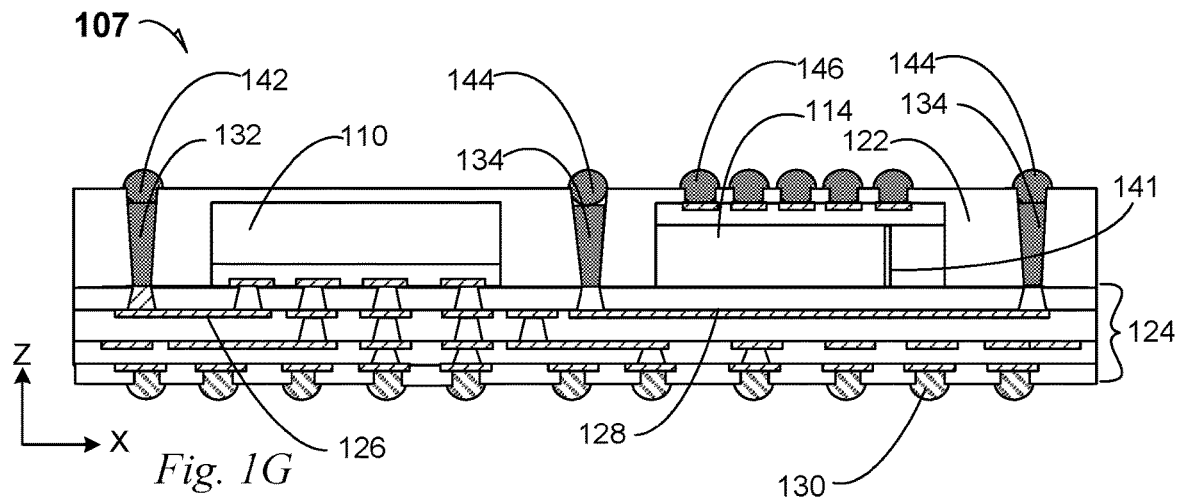
FIG. 1G is a cross-section elevation of the semiconductor device package depicted in FIG. 1E after further processing according to an embodiment.

FIG. 1G is a cross-section elevation of the semiconductor device package 105 depicted in FIG. 1E after further processing according to an embodiment. The semiconductor device package 107 has been processed by filling the through-mold via 132, the RFIC through-mold via 138 (see FIG. 1F) and the through-mold trench 134 with solder paste. In an embodiment, an electrical bump 142 is applied to the through-mold via 132. Similarly, electrical bumps 144 are applied to the through-mold trench 134 where a breach in the cover 122 exposes the through-mold trench 134. Additionally, a series of electrical bumps 146 is applied to the RFIC die 114 where bond pads have been exposed through the cover 122. Under some handling condition embodiments, the solder-paste electrical-bump array 130 is reflowed at a time different from forming the several electrical bumps 142, 144 and 146.

In an embodiment, a communication trace such as the communication trace 140, depicted in FIG. 1F, is not used. In an embodiment, a through-silicon via 141 is used that allows electrical communication to pass vertically in the negative-Z direction beyond the RFIC trace 128 and into the RDL 124, such that electrical communication has a shorter path into the RDL 124 than over top of the through-mold trench 134.

Figure 1H:
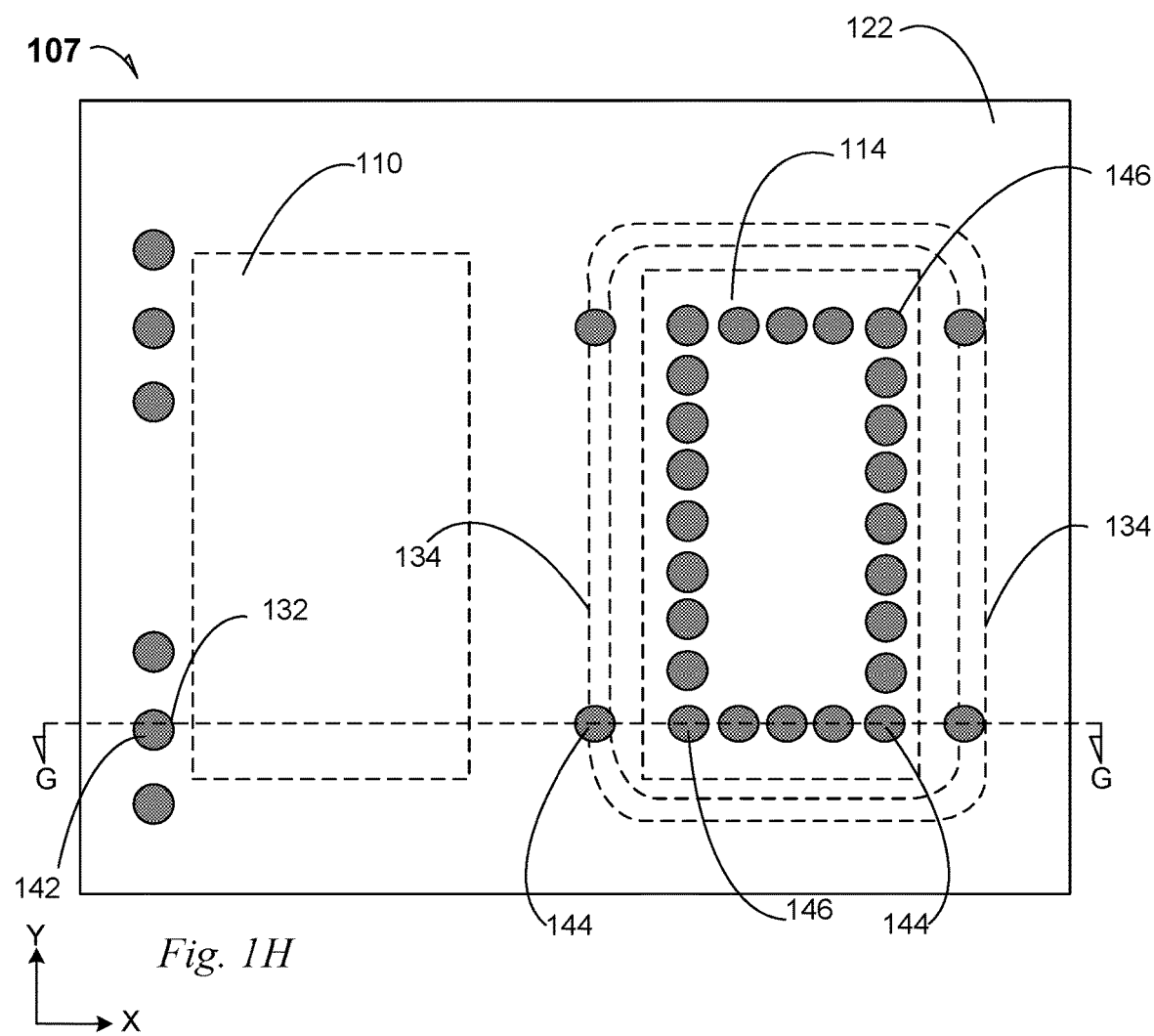
FIG. 1H is a top plan of the semiconductor device package depicted in FIG. 1G according to an embodiment.

FIG. 1H is a top plan of the semiconductor device package 107 depicted in FIG. 1G according to an embodiment. The view from FIG. 1G is taken from FIG. 1H along the section line G-G. The cover 122 obscures the processor die 110 as well as the RFIC die 114 and the through-mold trench 134, all of which are depicted in ghosted lines. The several electrical bumps 142, 144 and 146 protrude through breaches in the cover.

As illustrated, the through-mold trench 134 forms a shielding wall 134 to separate the RFIC die 114 from the processor die 110, both electrically and with electromagnetic interference (EMI).

When the semiconductor device package 107 has been assembled, it is mated to a phased-array antenna module. In an embodiment, the semiconductor device package 107 is at least part of a system-in-package (SIP) that is mated to a phased-array antenna module.

FIG. 2A is a cross-section elevation of a phased-array antenna module 201 according to an embodiment. An array workpiece such as a silicon substrate 210 (or any useful semiconductive core) has been repeatedly drilled to form a plurality of through-holes 212. Drilling is accomplished by a mechanical drill in an embodiment. Drilling may also be done by a laser drill tool.

FIG. 2B is a cross-section elevation of the phased-array antenna module 201 depicted in FIG. 2A after further processing according to an embodiment. The phased-array antenna module 202 has been metallically plated with a plating layer 214 such as a copper layer in an embodiment. Plating is accomplished with an electroplating process where a cathodic charge is applied to the silicon substrate 210, and metallic layer, such as a copper film 214 results as the plating layer 214.

FIG. 2C is a cross-section elevation of the phased-array antenna module 202 depicted in FIG. 2B after further processing according to an embodiment. The phased-array antenna module 203 has been mechanically polished by top grinding to remove substantially all the plating layer 214 from the top surface 216 in further preparation to fabricate antenna elements above the top surface 216. The plating layer 214 remains within the through-holes 212 as well as on the bottom surface 218.

FIG. 2D is a cross-section elevation of the phased-array antenna module 203 depicted in FIG. 2C after further processing according to an embodiment. The phased-array antenna module 204 has been processed by covering the silicon substrate 210 and the remaining plating layer 214 with a first dielectric layer 220. In an embodiment, the through-holes 212 are re-opened by a drilling process under conditions to electrically insulate the plating layer 214 within the through-holes 212. In an embodiment, the through-holes 212 are re-opened by an etching process. In an embodiment, source- or ground-contact recesses 222 are opened in the first dielectric layer 220 at the bottom side 218 of the semiconductor substrate 210.

Figure 2E:
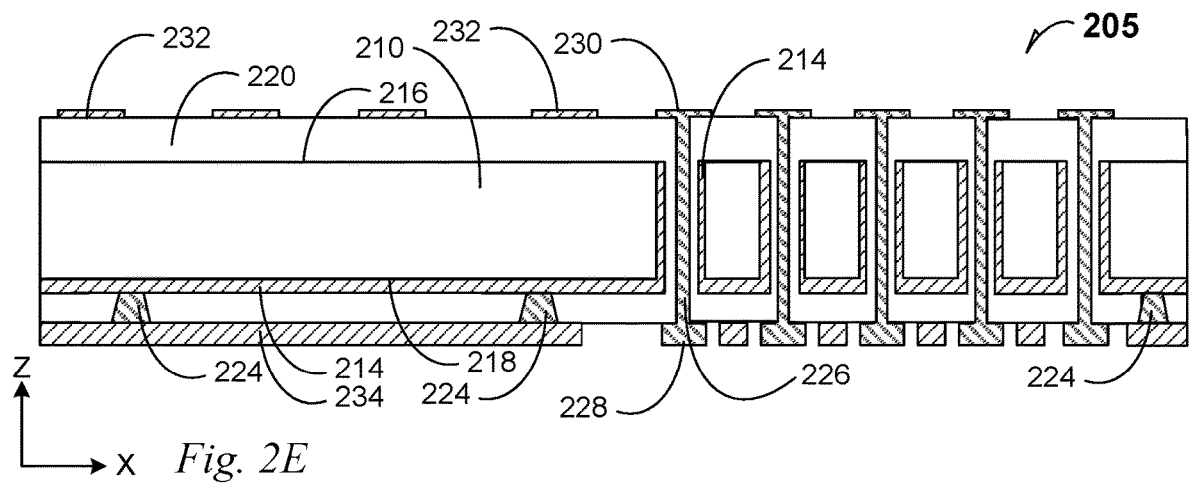
FIG. 2E is a cross-section elevation of the phased-array antenna module depicted in FIG. 2D after further processing according to an embodiment.

FIG. 2E is a cross-section elevation of the phased-array antenna module 204 depicted in FIG. 2D after further processing according to an embodiment. The phased-array antenna module 205 has been processed by plating source contacts 224 into the source-contact recesses 222 (see FIG. 2D). After plating the source contacts 224, plating is further done to form vertical-line interconnects 226. The vertical-line interconnects 226 include bottom contact pads 228 and direct-contact antenna pads 230. Additionally, fan-out antenna pads 232 are also plated onto the first dielectric layer 220. Plating is done in an embodiment by patterning a mask on the first dielectric layer 220 and plating onto and through the first dielectric layer 220. In connection with the vertical-line interconnect bottom contact pads 228, a voltage source trace 234 is also plated to be coupled to the plating layer 214 through the plating source contacts 224.

Figure 2F:
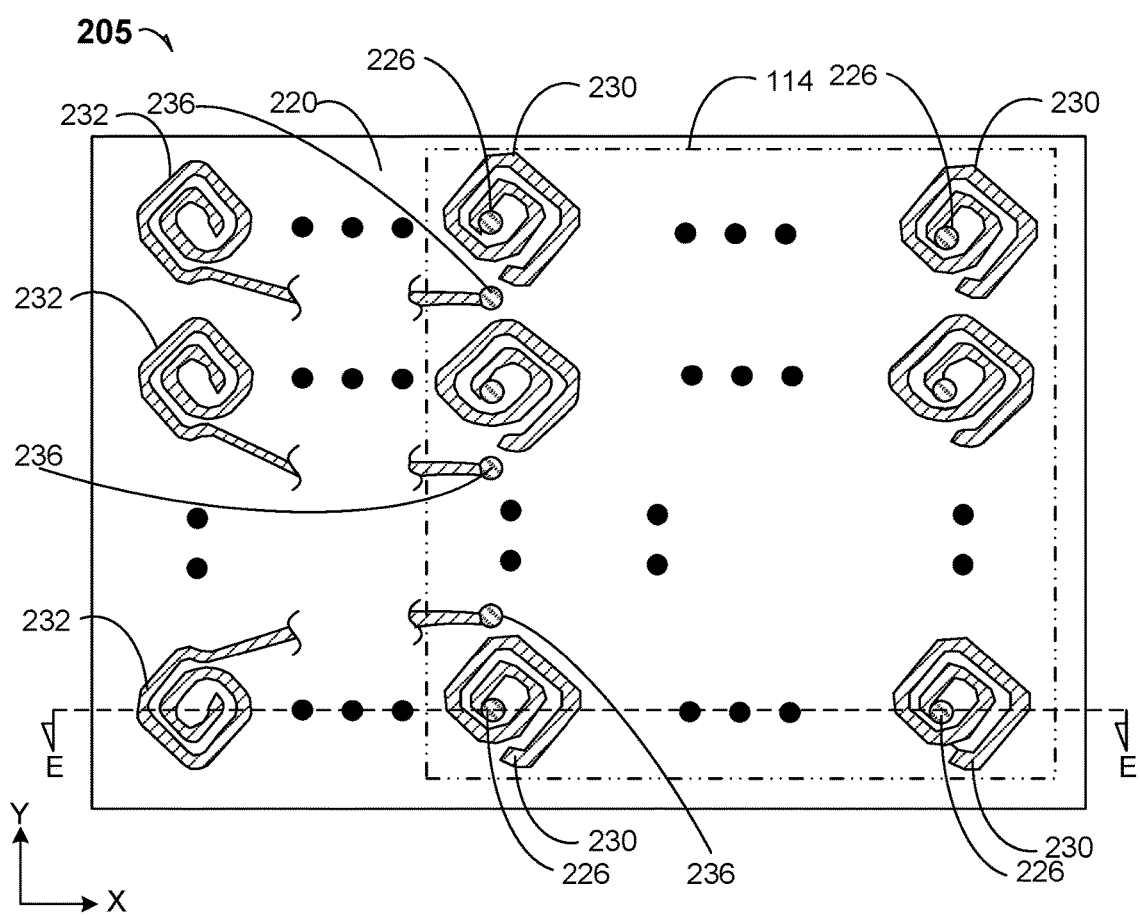
FIG. 2F is a top plan of a general depiction of the phased-array antenna module depicted in FIG. 2E according to an embodiment.

FIG. 2F is a top plan of a general depiction of the phased-array antenna module 205 depicted in FIG. 2E according to an embodiment. The view from FIG. 2F is taken generally from FIG. 2E along the section line E-E. Formation of the direct-contact antenna pads 230 are illustrated with the vertical-line interconnects 226 located in the center of the direct-contact antenna pads 230. Where allowed by a given application of the technology, the vertical-line interconnect 226 allows for in-situ contact within the direct-contact antenna pads 230. Formation of the fan-out antenna pads 232 is illustrated where routing from a contact point 236 that is not central to the fan-out antenna pads.

FIG. 2G is a cross-section elevation of the phased-array antenna module 205 depicted in FIG. 2E after further processing according to an embodiment. The phased-array antenna module 206 has been processed by forming a protection layer 238 above the antenna elements 230 and 232. In an embodiment, a solder-resist layer 240 is formed to mostly cover the bottom contact pads 228 and the source trace 234, with solder-resist opens (SROs) 244 and 246 to expose selected respective source trace 234 and vertical-line interconnect bottom contact pads 228.

FIG. 3 is a cross-section elevation of a wafer-level fan-out package with a wide-band phased-array antenna module 300 according to an embodiment. The semiconductor device package 107 as depicted generally in FIG. 1G, is the base for the phased-array antenna module 206 depicted generally in FIG. 2G.

Signal integrity that is generated within the RFIC die 114 is useful as it is propagated through the vertical-line interconnects 226 from the RFIC die 114. With the presence of the plating layer 214 as it shields the vertical-line interconnect 226, it is also coupled to the voltage source (ground) for the entire wafer-level fan-out package with a wide-band phased array antenna module 300. Further as illustrated in FIG. 3, the RFIC trace 128 along with the through-mold trench 134, creates a shielding structure around the RFIC DIE 114 to further enable signal integrity for the phased array antenna elements and to reduce electromagnetic interference (EMI) to the processor die 110. With several occurrences of RFIC traces 128 (into and out of the plane of the drawing), the through-mold trench 134 forms an EMI shielding basin into which the RFIC die 114 is embedded.

In an embodiment, a board 350 such as a motherboard 350 is mated to the electrical-bump array 130. In an embodiment, the board 350 is protected by an external shell 352 that allows for the board 350 to be near or integral to an external structure 352 of a computing system.

Figure 4:
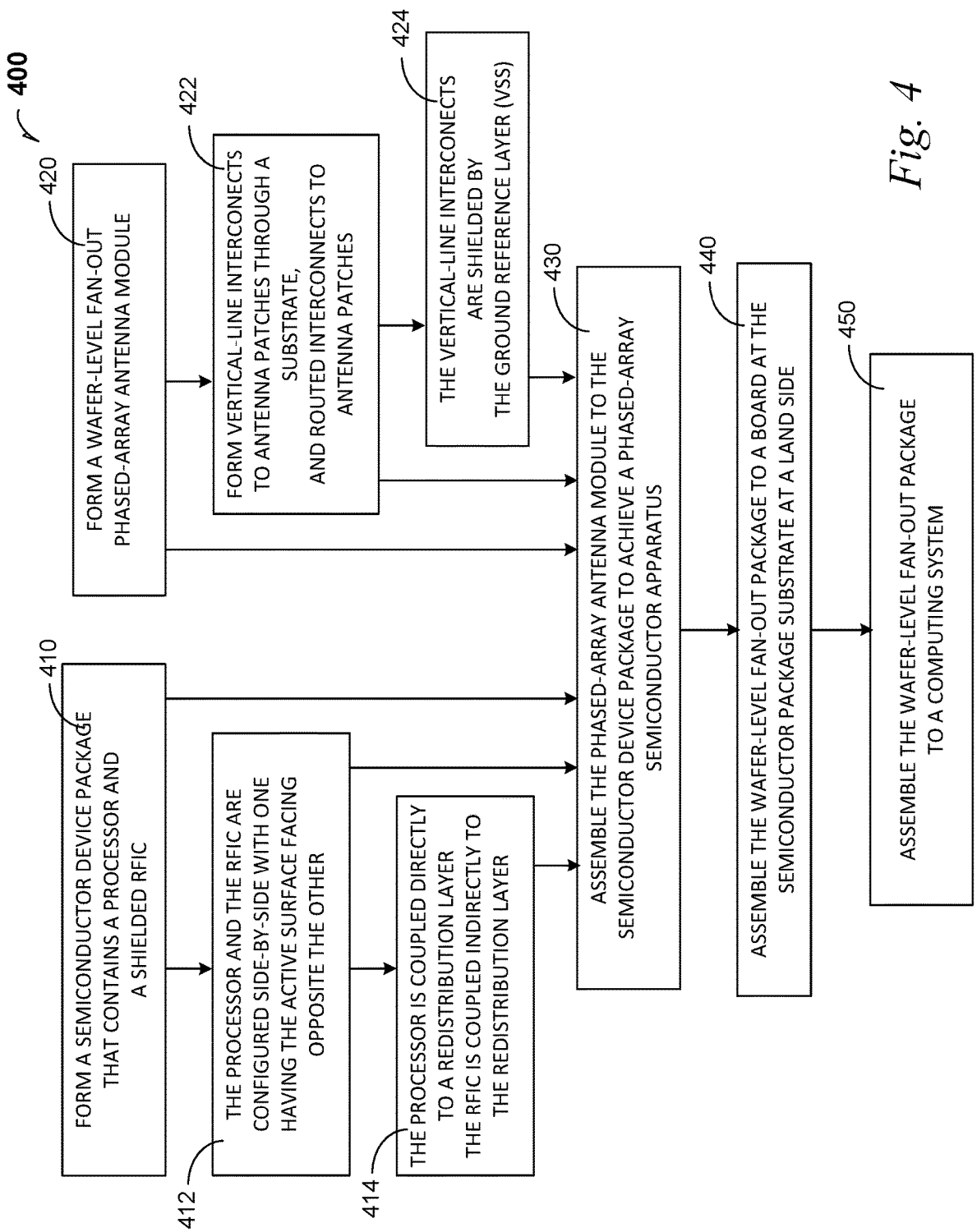
FIG. 4 is a process flow diagram according to an embodiment.

FIG. 4 is a process flow diagram 400 according to an embodiment.

At 410, the process includes forming a semiconductor device package that contains a processor die and a shielded radio-frequency integrated circuit (RFIC) die. The term "shielded" means physically and at least partially surrounded, and some blockage of interfering signal noise is effected.

At 412, the process allows the processor die and the RFIC die are configured side-by-side with one having the first surface facing opposite the other.

At 414, the process allows the processor die to be coupled directly to a redistribution layer (RDL) and the RFIC die is coupled indirectly to the RDL. Where the processor die is facing the RDL in flip-chip style, the RFIC die may be coupled by a TSV, or it may be coupled by at least one trace that breaches the through-mold trench.

At 420, the process includes forming a wafer-level fan-out phased-array antenna module.

At 422, the process allows for forming vertical-line interconnects to antenna patches through a substrate, and routed interconnects to antenna patches.

At 424, the process allows the vertical-line interconnects to be formed by shielding them with the ground source structure, which is the plating layer.

At 430, the process includes assembling the phased-array antenna module to the semiconductor device package.

At 440, the process includes assembling the wafer-level fan-out package to a board at the semiconductor package substrate at a land side.

At 450, the process includes assembling the system-in-package and wide-band phased-array antenna module to a computing system.

Figure 5:
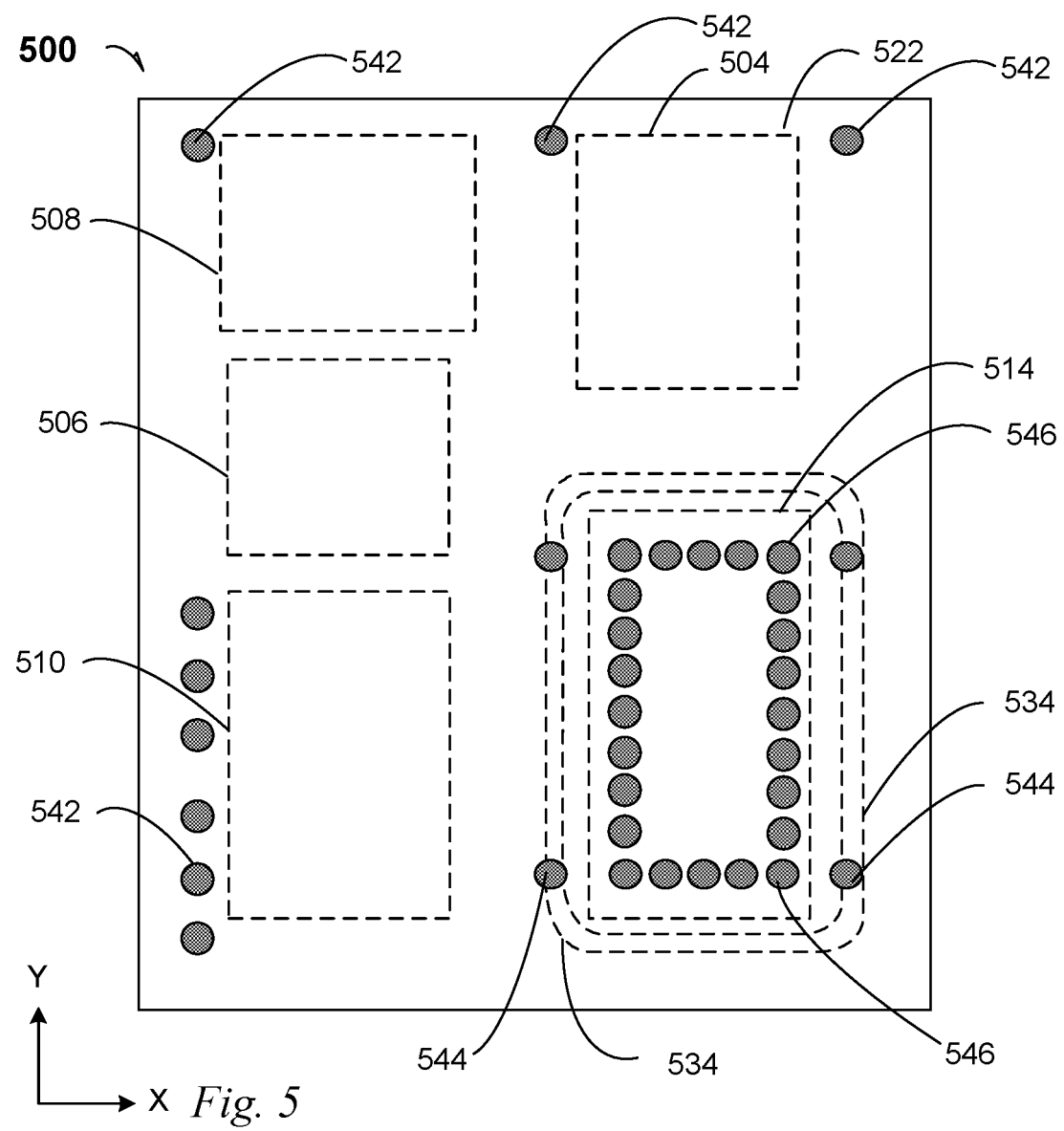
FIG. 5 is a top plan of a system-in-package that is configured to mate with a wideband phased-array antenna module according to an embodiment.

FIG. 5 is a top plan of a system-in-package 500 that is configured to mate with a wide-band phased-array antenna module according to an embodiment. The view from FIG. 5 analogous to at least part of the view of FIG. 1H with additional devices to achieve a specific system-in-package. A cover 522 obscures a processor die 510 as well as an RFIC die 514 and a through-mold trench 534, all of which are depicted in ghosted lines. Several electrical bumps 542, 544 and 546 protrude through breaches in the cover 522.

As illustrated, the through-mold trench 534 forms a shielding wall 534 to separate the RFIC 514 from other active devices. For example, the through-mold trench 534 separates the RFIC 514 from the processor die 510, as well as other devices including a memory module 504. In an embodiment, a platform-controller hub (PCH) 506 is disposed beneath the cover 522. In an embodiment, a memory-controller hub (MCH) 508 is disposed near the memory module 504.

When the system in package 500 has been assembled, it is mated to a wide-band phased-array antenna module with the several electrical bumps 542.

Figure 6:
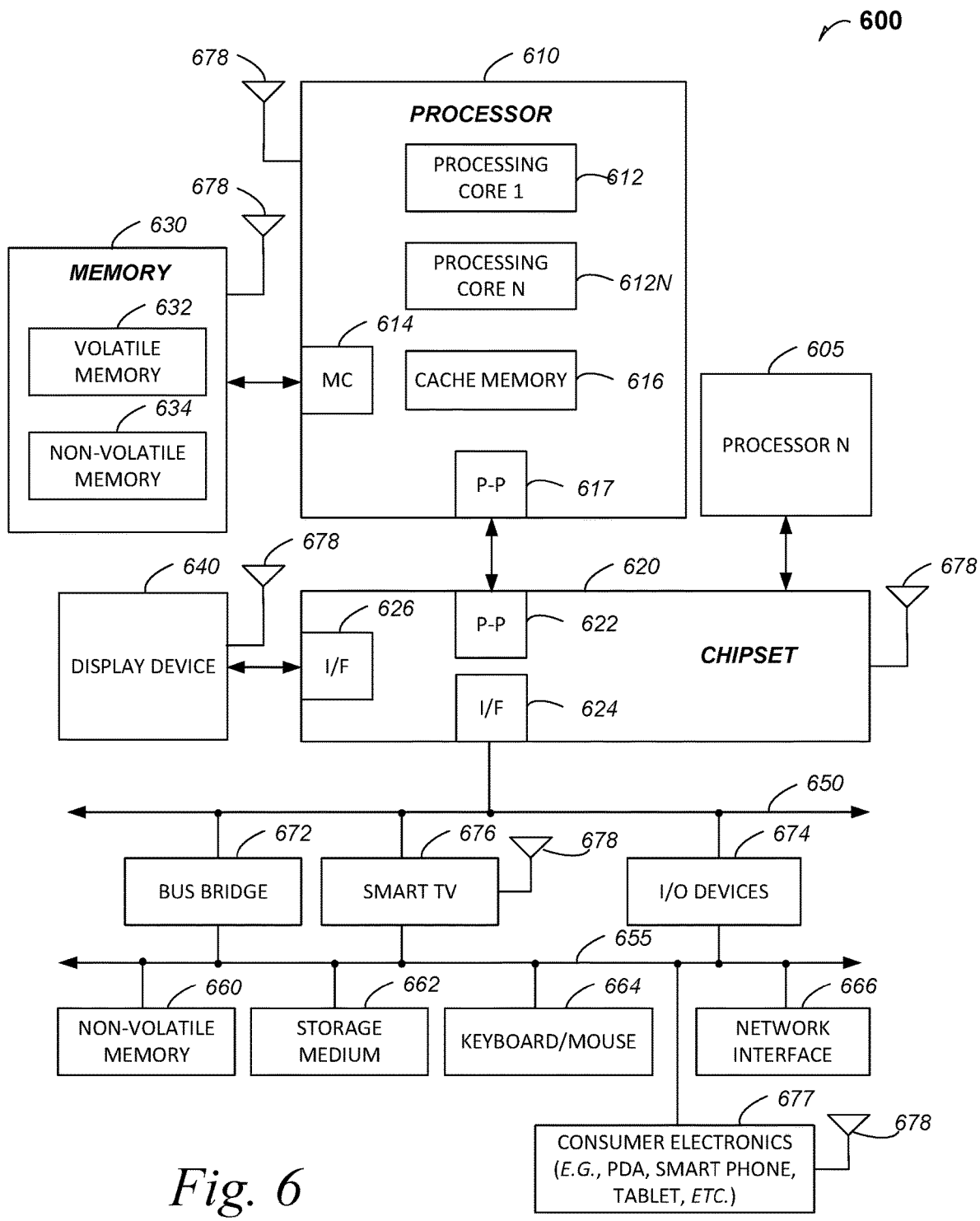
FIG. 6 is included to show an example of a higher-level device application for the disclosed embodiments.

FIG. 6 is included to show an example of a higher-level device application for the disclosed embodiments. The system-in-package with a wide-band phased-array antenna module apparatus embodiments may be found in several parts of a computing system. In an embodiment, the system-in-package with a wide-band phased-array antenna module apparatus is part of a communications apparatus such as is affixed to a cellular communications tower. The system-in-package with a wide-band phased-array antenna module apparatus may also be referred to as a system-in-package with a wide-band phased-array antenna apparatus. In an embodiment, a computing system 400 includes, but is not limited to, a desktop computer. In an embodiment, a system 400 includes, but is not limited to a laptop computer. In an embodiment, a system 400 includes, but is not limited to a netbook. In an embodiment, a system 400 includes, but is not limited to a tablet. In an embodiment, a system 400 includes, but is not limited to a notebook computer. In an embodiment, a system 400 includes, but is not limited to a personal digital assistant (PDA). In an embodiment, a system 400 includes, but is not limited to a server. In an embodiment, a system 400 includes, but is not limited to a workstation. In an embodiment, a system 400 includes, but is not limited to a cellular telephone. In an embodiment, a system 400 includes, but is not limited to a mobile computing device. In an embodiment, a system 400 includes, but is not limited to a smart phone. In an embodiment, a system 400 includes, but is not limited to an internet appliance. Other types of computing devices may be configured with the microelectronic device that includes system-in-package with a wide-band phased-array antenna module apparatus embodiments.

In an embodiment, the processor 410 has one or more processing cores 412 and 412N, where 412N represents the Nth processor core inside processor 410 where N is a positive integer. In an embodiment, the electronic device system 400 using a system-in-package with a wide-band phased-array antenna module apparatus embodiment that includes multiple processors including 410 and 405, where the processor 405 has logic similar or identical to the logic of the processor 410. In an embodiment, the processing core 412 includes, but is not limited to, pre-fetch logic to fetch instructions, decode logic to decode the instructions, execution logic to execute instructions and the like. In an embodiment, the processor 410 has a cache memory 416 to cache at least one of instructions and data for the system-in-package with a wide-band phased-array antenna module apparatus in the system 400. The cache memory 416 may be organized into a hierarchal structure including one or more levels of cache memory.

In an embodiment, the processor 410 includes a memory controller 414, which is operable to perform functions that enable the processor 410 to access and communicate with memory 430 that includes at least one of a volatile memory 432 and a non-volatile memory 434. In an embodiment, the processor 410 is coupled with memory 430 and chipset 420. In an embodiment, the chipset 420 is part of a system-in-package with a wide-band phased-array antenna module apparatus depicted in FIG. 5. The processor 410 may also be coupled to a wireless antenna 478 to communicate with any device configured to at least one of transmit and receive wireless signals. In an embodiment, the wireless antenna interface 478 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 434 includes, but is not limited to, flash memory, phase change memory (PCM), read-only memory (ROM), electrically erasable programmable read-only memory (EEPROM), or any other type of non-volatile memory device.

The memory 430 stores information and instructions to be executed by the processor 410. In an embodiment, the memory 430 may also store temporary variables or other intermediate information while the processor 410 is executing instructions. In the illustrated embodiment, the chipset 420 connects with processor 410 via Point-to-Point (PtP or P-P) interfaces 417 and 422. Either of these PtP embodiments may be achieved using a system-in-package with a wide-band phased-array antenna module apparatus embodiment as set forth in this disclosure. The chipset 420 enables the processor 410 to connect to other elements in system-in-package with a wide-band phased-array antenna module apparatus embodiments in a system 400. In an embodiment, interfaces 417 and 422 operate in accordance with a PtP communication protocol such as the Intel® QuickPath Interconnect (QPI) or the like. In other embodiments, a different interconnect may be used.

In an embodiment, the chipset 420 is operable to communicate with the processor 410, 405N, the display device 440, and other devices 472, 476, 474, 460, 462, 464, 466, 477, etc. The chipset 420 may also be coupled to a wireless antenna 478 to communicate with any device configured to at least do one of transmit and receive wireless signals.

The chipset 420 connects to the display device 440 via the interface 426. The display 440 may be, for example, a liquid crystal display (LCD), a plasma display, cathode ray tube (CRT) display, or any other form of visual display device. In an embodiment, the processor 410 and the chipset 420 are merged into a system-in-package with a wide-band phased-array antenna module apparatus in a system. Additionally, the chipset 420 connects to one or more buses 450 and 455 that interconnect various elements 474, 460, 462, 464, and 466. Buses 450 and 455 may be interconnected together via a bus bridge 472 such as at least one system-in-package with a wide-band phased-array antenna module apparatus embodiment. In an embodiment, the chipset 420 couples with a non-volatile memory 460, a mass storage device(s) 462, a keyboard/mouse 464, and a network interface 466 by way of at least one of the interface 424 and 474, the smart TV 476, and the consumer electronics 477, etc.

In an embodiment, the mass storage device 462 includes, but is not limited to, a solid state drive, a hard disk drive, a universal serial bus flash memory drive, or any other form of computer data storage medium. In one embodiment, the network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system-in-package with a wide-band phased-array antenna module apparatus embodiment in a computing system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into the processor core 412.

Where useful, the computing system 400 may have a broadcasting structure interface such as for affixing the apparatus to a cellular tower.

To illustrate the system-in-package with a wide-band phased-array antenna module apparatus embodiments and methods disclosed herein, a non-limiting list of examples is provided herein:

Example 1 is a system in package, comprising: a processor die and a radio-frequency integrated circuit (RFIC) die embedded in a semiconductor device package, wherein the processor die includes an active surface disposed against a redistribution layer (RDL), wherein the RFIC die includes a first surface facing opposite the processor die first surface; a wide-band phased-array antenna module mated to the semiconductor device package, wherein the RFIC die is coupled to the wide-band phased-array antenna module with at least one vertical-line interconnect, wherein the vertical-line interconnect is at least partially surrounded by grounded voltage source, and wherein the RFIC die is isolated within a through-mold trench.

In Example 2, the subject matter of Example 1 optionally includes wherein the wide-band phased-array antenna module includes a semiconductive core including a plurality of through holes, through one hole of which the vertical-line interconnect is disposed.

In Example 3, the subject matter of any one or more of Examples 1-2 optionally include wherein the wide-band phased-array antenna module includes a semiconductive core, wherein the grounded voltage source includes a metallic plating layer that contacts the semiconductive core within at least one through hole and on a bottom surface, further including a first dielectric layer that is disposed on the metallic plating layer at the bottom surface, within the at least one through hole, and on the semiconductive core at a top surface.

In Example 4, the subject matter of Example 3 optionally includes wherein the at least one vertical-line interconnect is insulated by the first dielectric layer within one of the plurality of through holes.

In Example 5, the subject matter of any one or more of Examples 3-4 optionally include wherein the at least one vertical-line interconnect is insulated by the first dielectric layer within one of the plurality of through holes, further including a protection layer that covers a direct-contact antenna pad that contacts the at least one vertical-line interconnect.

In Example 6, the subject matter of any one or more of Examples 1-5 optionally include wherein the processor die is grounded to a grounded voltage source structure.

In Example 7, the subject matter of any one or more of Examples 1-6 optionally include wherein the at least one vertical-line interconnect contacts a direct-contact antenna pad.

In Example 8, the subject matter of any one or more of Examples 1-7 optionally include wherein the processor die is grounded to the grounded source structure, wherein the at least one vertical-line interconnect contacts a direct-contact antenna pad on a first dielectric layer, and further including at least one fan-out antenna pad disposed on the first dielectric layer and coupled to the RFIC die.

In Example 9, the subject matter of any one or more of Examples 1-8 optionally include wherein the RFIC die is further isolated by at least one ground trace disposed between the RFIC die at an RFIC die second surface, and the RDL.

In Example 10, the subject matter of any one or more of Examples 1-9 optionally include wherein the at least one vertical-line interconnect contacts a direct-contact antenna pad that is disposed above the RFIC first surface on a first dielectric layer, and wherein the fan-out antenna pad is disposed above and lateral to the RFIC first surface.

In Example 11, the subject matter of any one or more of Examples 1-10 optionally include wherein the direct-contact antenna pad and the fan-out antenna pad are disposed on a first dielectric layer, and wherein the first dielectric layer is covered by a protection layer.

In Example 12, the subject matter of any one or more of Examples 1-11 optionally include a board coupled to an electrical bump array disposed on the semiconductor device package on a land side.

In Example 13, the subject matter of any one or more of Examples 1-12 optionally include at least one memory module disposed in the semiconductor device package, a memory-controller hub and a platform controller hub.

Example 14 is a method of assembling a wide-band phased-array antenna in a system in package, comprising: embedding a processor die and a radio frequency integrated circuit (RFIC) die in a semiconductor device package, wherein the processor die is mated at a first surface with a redistribution layer (RDL), and wherein the RFIC die is embedded with a first surface facing opposite the processor die first surface; forming a wide-band phased-array antenna module under conditions to include a vertical-line interconnect that is at least partially surrounded with a ground-voltage plating layer in a through-hole in a semiconductive substrate; and assembling the wide-band phased-array antenna module to the semiconductor device package under conditions to allow at least one vertical-line interconnect to each contact a maximum of one electrical bump disposed on a bond pad of the RFIC die.

In Example 15, the subject matter of Example 14 optionally includes wherein the processor die and RFIC die are configured side-by-side, and wherein the RFIC die is at least partially surrounded within a through-mold trench that is formed to laterally surround the RFIC die.

In Example 16, the subject matter of any one or more of Examples 14-15 optionally include wherein the wide-band phased-array antenna module is formed with a plurality of vertical-line interconnects that pass through the semiconductive substrate, wherein each vertical-line interconnect is at least partially surrounded with the ground-voltage plating layer, and wherein each vertical-line interconnect is insulated with a first dielectric layer that contacts the semiconductive substrate on a top surface that is opposite to a bottom surface, and wherein the first dielectric layer is also formed with the plurality of through-holes.

In Example 17, the subject matter of Example 16 optionally includes forming the ground-voltage plating layer on the top surface of the semiconductor substrate, within the plurality of through-holes, and on the bottom surface; and removing the ground-voltage plating layer from the top surface; followed by forming the first dielectric layer on the top surface, within the plurality of through holes, and on the ground voltage plating layer that covers the bottom surface; and opening the plurality of through holes under conditions to retain the first dielectric layer on the ground voltage plating in the plurality of through holes; and forming the at least one vertical-line interconnect within one of the plurality of through holes.

Example 18 is a computing system, comprising: a processor die and a wide-band radio-frequency integrated circuit (RFIC) die embedded in a semiconductor device package, wherein the processor die includes a first surface disposed against a redistribution layer (RDL), wherein the RFIC die includes a first surface facing opposite the processor die first surface; a wide-band phased-array antenna module mated to the semiconductor device package, wherein the wide-band phased-array antenna module includes a semiconductive core, wherein the grounded voltage source includes a metallic plating layer that contacts the semiconductive core within at least one through hole and on a bottom surface, further including a first dielectric layer that is disposed on the metallic plating layer at the bottom surface, within the at least one through hole, and on the semiconductive core at a top surface; wherein the RFIC die is coupled to the wide-band phased-array antenna module with at least one vertical-line interconnect, wherein the vertical-line interconnect is at least partially surrounded by a grounded voltage source structure, and wherein the RFIC die is isolated within a through-mold trench; and a board coupled to an electrical bump array disposed on the semiconductor device package on a land side, and wherein the board is coupled to an external shell.

In Example 19, the subject matter of Example 18 optionally includes wherein the processor die is grounded to the grounded source, wherein the at least one vertical-line interconnect contacts a direct-contact antenna pad, and further including at least one fan-out antenna pad coupled to the RFIC.

In Example 20, the subject matter of any one or more of Examples 18-19 optionally include wherein the processor die and the RFIC die are part of a chipset that includes a memory module, a memory-controller hub and a platform controller hub.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A system in package, comprising:
a processor die and a radio-frequency integrated circuit (RHC) die embedded in a semiconductor device package, wherein the processor die includes an active surface disposed against a redistribution layer (RDL), wherein the RFIC die includes an active surface facing opposite the processor die active surface; and
a wide-band phased-array antenna module mated to the semiconductor device package, wherein the RFIC die is coupled to the wide-band phased-array antenna module with at least one vertical interconnect, wherein the vertical interconnect is shielded by a reference voltage layer, and wherein the RFIC die is shielded within a through-mold trench.

2. The system in package of claim 1, wherein the wide-band phased-array antenna module includes a semiconductive core including a plurality of through holes, through one hole of which the vertical interconnect is disposed.

3. The system in package of claim 1, wherein the wide-band phased-array antenna module includes a semiconductive core, wherein the reference voltage layer includes a metallic plating layer that contacts the semiconductive core within at least one through hole and on a bottom surface, further including a first dielectric layer that is disposed on the metallic plating layer at the bottom surface, within the at least one through hole, and on the semiconductive core at a top surface.

4. The system in package of claim 3, wherein the at least one vertical interconnect is insulated by the first dielectric layer within one of the plurality of through holes.

5. The system in package of claim 3, wherein the at least one vertical interconnect is insulated by the first dielectric layer within one of the plurality of through holes, further including a protection layer that covers a direct-contact antenna pad that contacts the at least one vertical interconnect.

6. The system in package of claim 1, wherein the processor die is associated with a ground (Vss) reference voltage source, and wherein the reference voltage layer is coupled to the processor die.

7. The system in package of claim 1, wherein the at least one vertical interconnect contacts a direct-contact antenna pad.

8. The system in package of claim 1, wherein the processor die is associated to a ground (Vss) reference voltage source, wherein the at least one vertical interconnect contacts a direct-contact antenna pad on a first dielectric layer, and further including at least one fan-out antenna pad disposed on the first dielectric layer and coupled to the RFIC die.

9. The system in package of claim 1, wherein the RFIC die is further shielded by at least one ground (Vss) trace disposed between the RFIC die at an RFIC die backside surface, and the RDL.

10. The system in package of claim 1, wherein the at least one vertical interconnect contacts a direct-contact antenna pad that is disposed above the RFIC active surface on a first dielectric layer, and wherein the fan-out antenna pad is disposed above and lateral to the RFIC active surface.

11. The system in package of claim 1, wherein the direct-contact antenna pad and the fan-out antenna pad are disposed on a first dielectric layer, and wherein the first dielectric layer is covered by a protection layer.

12. The system in package of claim I, further including a board coupled to an electrical hump array disposed on the semiconductor device package on a land side.

13. The system in package of claim 1, further including, at least one memory module disposed in the semiconductor device package, a memory-controller hub and a platform controller hub.

14. A system in package, comprising:
    a processor die and a radio-frequency integrated circuit (RFIC) die embedded in a semiconductor device package, wherein the processor die includes an active surface disposed against a redistribution layer (RDL), wherein the RFIC die includes an active surface facing opposite the processor die active surface;
    a wide-band phase-array antenna module mated to the semiconductor device package, wherein the RFIC die is coupled to the wide-band phased-array antenna module with at least one vertical interconnect, wherein the vertical interconnect is shielded by a reference voltage layer, and wherein the RFIC die is shielded within a through-mold trench, wherein the wide-band phased-array antenna module includes a semiconductive core including a plurality of through is further shielded by at least one ground (Vss) trace disposed between the RFIC dies at an RFIC die backside surface, and the RDL.

15. The system in package of claim 14, wherein the at least one vertical interconnect contacts a direct-contact antenna pad that is disposed above the RFIC active surface on a first dielectric layer, and wherein the fan-out antenna pad is disposed above and lateral to the RFIC active surface, and wherein the processor die is associated with a associated with a ground (Vss) reference voltage source, and wherein the reference voltage layer is couple to the processor die.

16. The system in package of claim 14, wherein the direct-contact antenna pad and the fan-out antenna pad are disposed on a first dielectric layer, and wherein the first dielectric layer is covered by a protection layer.

17. The system in package of claim 14, further including;
    a hoard coupled to an electrical bump array disposed on the semiconductor device package on a land side; and
    an external shell that is integral to the hoard.

18. The system in package of claim 14, further including, at least one memory module disposed in the semiconductor device package.

19. The system in package of claim 14, further including;
    at least one memory module disposed in the semiconductor device package; and
    a memory-controller hub disposed in the semiconductor device package.

20. The system in package of claim 17, further including a platform controller hub disposed in the semiconductor device package.

21. The system in package of claim 14, wherein the at least one vertical interconnect contacts a direct-contact antenna pad that is disposed above the RFIC active surface on a first dielectric layer, and wherein the fan-out antenna pad is disposed above and lateral to the RFIC active surface, and wherein the processor die is associated with a associated with a ground (Vss) reference voltage source, wherein the reference voltage layer is couple to the processor die, and
    wherein the direct-contact antenna pad and the fan-out antenna pad are disposed on a first dielectric layer, and wherein the first dielectric layer is covered by a protection layer.

* * * * *